(12) United States Patent
Lee

(10) Patent No.: US 11,889,628 B2
(45) Date of Patent: Jan. 30, 2024

(54) ELECTRONIC CONTROL DEVICE

(71) Applicant: HYUNDAI KEFICO CORPORATION, Gyeonggi-do (KR)

(72) Inventor: Wankyu Lee, Gyeonggi-do (KR)

(73) Assignee: Hyundai Kefico Corporation, Gyeonggi-do (KR)

( * ) Notice: Subject to any disclaimer, the term of this patent is extended or adjusted under 35 U.S.C. 154(b) by 0 days.

(21) Appl. No.: 17/729,694

(22) Filed: Apr. 26, 2022

(65) Prior Publication Data

US 2023/0199963 A1 Jun. 22, 2023

(30) Foreign Application Priority Data

Apr. 28, 2021 (KR) ........................ 10-2021-0054870

(51) Int. Cl.
*H05K 1/14* (2006.01)
*H05K 5/00* (2006.01)

(52) U.S. Cl.
CPC ............ *H05K 1/148* (2013.01); *H05K 5/003* (2013.01); *H05K 5/0069* (2013.01)

(58) Field of Classification Search
CPC ....... H05K 1/148; H05K 5/003; H05K 5/0069
USPC ......................................................... 361/748
See application file for complete search history.

(56) References Cited

U.S. PATENT DOCUMENTS

| 2002/0187674 | A1* | 12/2002 | Hirose | H01R 12/7005 |
| | | | | 439/495 |
| 2011/0121895 | A1* | 5/2011 | Morello | G06N 10/00 |
| | | | | 257/E29.322 |
| 2014/0120749 | A1 | 5/2014 | Drew et al. | |
| 2014/0165797 | A1* | 6/2014 | Hsieh | B25B 23/1425 |
| | | | | 81/479 |

FOREIGN PATENT DOCUMENTS

| KR | 10-0509779 B1 | 8/2005 |
| KR | 2006-0134998 A | 12/2006 |
| KR | 101816032 B1 | 1/2018 |
| KR | 10-1836970 B1 | 3/2018 |
| KR | 20190078452 A * | 3/2018 |
| KR | 10-2018-0122307 A | 11/2018 |
| KR | 10-2020-0134992 A | 12/2020 |

* cited by examiner

*Primary Examiner* — Andargie M Aychillhum
(74) *Attorney, Agent, or Firm* — Fox Rothschild LLP

(57) ABSTRACT

Disclosed is an electronic control device using a connector-integrated housing and a bendable printed circuit board. The electronic control device according to an exemplary embodiment of the present invention includes: a housing including a first body formed with an opening at one side and a second body connected with the first body through a hinge part, the opening being closed according to a rotation of the second body; a printed circuit board including a first substrate part and a second substrate part connected through a flexible connection part; and a connector coupled to the second body, in which the first substrate part is inserted into the first body, and the second substrate part is coupled with the connector to be connected with the second body.

6 Claims, 9 Drawing Sheets

ELECTRONIC CONTROL DEVICE

CROSS-REFERENCE TO RELATED APPLICATIONS

This application claims priority to and the benefit of Korean Patent Application No. 10-2021-0054870 filed in the Korean Intellectual Property Office on Apr. 28, 2021, the entire contents of which are incorporated herein by reference.

TECHNICAL FIELD

The present invention relates to an electronic control device, and particularly, to an electronic control device using a connector-integrated housing and a bendable printed circuit board.

BACKGROUND

In general, an electronic control device, such as an ECU, for electronically controlling various devices is mounted on a vehicle. The electronic control device receives information from sensors or switches installed in each part of the vehicle. The electronic control device functions to perform various electronic controls to improve the riding comfort and safety of the vehicle by processing the received information and to provide various conveniences to a driver and occupants.

For example, the electronic control device, such as an ECU, for controlling states of an engine, automatic transmission, an Anti-Lock Brake System (ABS), and the like with a computer serves to control all parts of the vehicle, such as a driving system, a braking system, and a steering system, along with the automatic transmission control, along with the development of the vehicle and the computer performance.

The electronic control device, such as the ECU, has a structure including a housing formed of an upper cover and a lower base, a printed circuit board accommodated inside the housing, a connector coupled to a front end of the printed circuit board for a connection of an external socket, and the like.

In the meantime, a housing in which a cover and a base are manufactured by one injection molding has been disclosed in the prior art, but even in the case of the housing in which a cover and a base are manufactured by one injection molding, there is a disadvantage in that the connector needs to be coupled to the cover and the base as a separate configuration.

SUMMARY

In one aspect, an electronic control device is provided in which a housing and a connector are integrally configured to reduce costs and to simplify an assembly process.

In an exemplary embodiment, an electronic control device is provided, comprising: a housing including a first body formed with an opening at one side and a second body connected with the first body through a hinge part, the opening being closed according to a rotation of the second body; a printed circuit board including a first substrate part and a second substrate part connected through a flexible connection part; and a connector coupled to the second body, in which the first substrate part is inserted into the first body, and the second substrate part is coupled with the connector to be connected with the second body.

When the second body is rotated in a direction of the first body, the first substrate part may be inserted into the first body while at least a part of the first substrate part moves up or moves down according to a position of the hinge part.

The first body may include: a coupling part coupled to the second body; and a flat portion which is formed at one inner end of the first body and to which one side of the first substrate part is inserted.

The first body may include: an inclined portion formed at an inner upper end surface of the first body, extending from one side of the flat portion, and formed to be inclined to have a predetermined angle to the flat portion; and a fixed portion to which the other side of the first substrate part is fixed.

The inclined portion may guide a movement of the first substrate part when the first substrate part is inserted into the first body.

The first substrate part may include a protrusion inserted into the fixed portion at the other side.

The second substrate part may have an angle perpendicular to the first substrate part when the second body is coupled to the coupling part.

The connector may be provided with at least one terminal at one side, and the terminal may be coupled to one side of the second substrate part.

One or more the above steps may be carried out through use of a processor or control unit.

In another aspect, a vehicle is provided that comprises an electronic control device as disclosed herein.

The presents devices and systems can provide an advantage in that it is possible to provide the electronic control device in which the housing and the connector are integrally configured to reduce costs.

There is an advantage in that it is possible to provide the electronic control device in which the housing and the connector are integrally configured, so that the number of components is relatively small and an assembling process is simple.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 1:
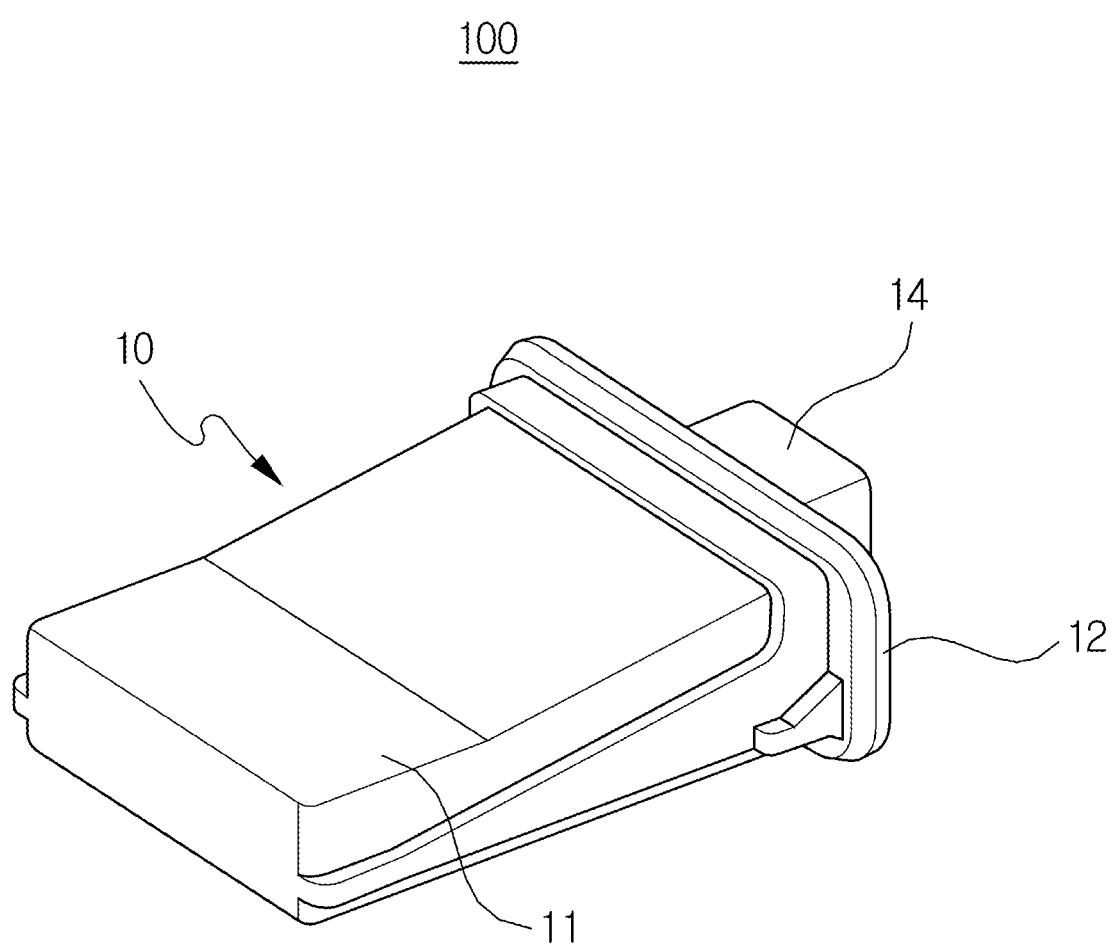
FIG. 1 is an overall perspective view of an electronic control device according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor and is specifically programmed to execute the processes described herein. The memory is configured to store the modules and the processor is specifically configured to execute said modules to perform one or more processes which are described further below.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

In addition, terms such as " . . . part", " . . . unit", " . . . module", etc. described in the specification mean a unit that processes at least one function or operation, which may be implemented by hardware or software or a combination of hardware and software.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Hereinafter, exemplary embodiments of the present invention will be described in detail with reference to the accompanying drawings. First of all, it should be noted that in giving reference numerals to elements of each drawing, like reference numerals refer to like elements even though like elements are shown in different drawings. Further, in the following description of the present invention, a detailed description of known configurations or functions incorporated herein will be omitted when it is judged that the detailed description may make the subject matter of the present disclosure unclear. It should be understood that although the exemplary embodiment of the present invention is described hereafter, the spirit of the present invention is not limited thereto and the present invention may be changed and modified in various ways by those skilled in the art.

Figure 2:
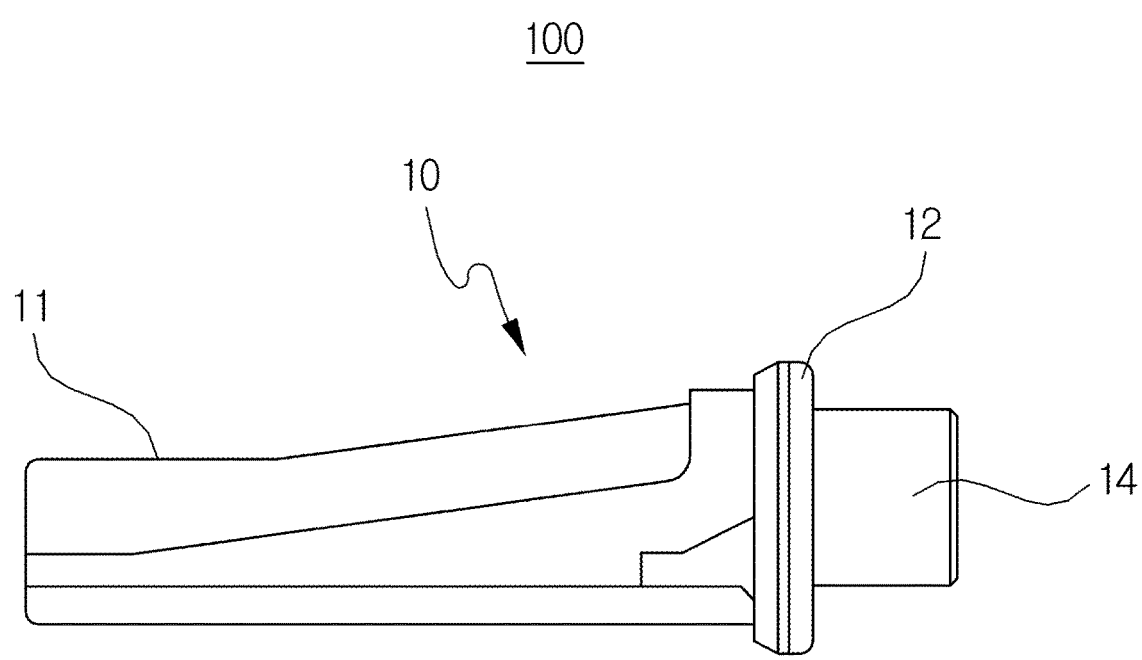
FIG. 2 is a diagram illustrating a lateral surface of the electronic control device according to the exemplary embodiment of the present invention.
Figure 3:
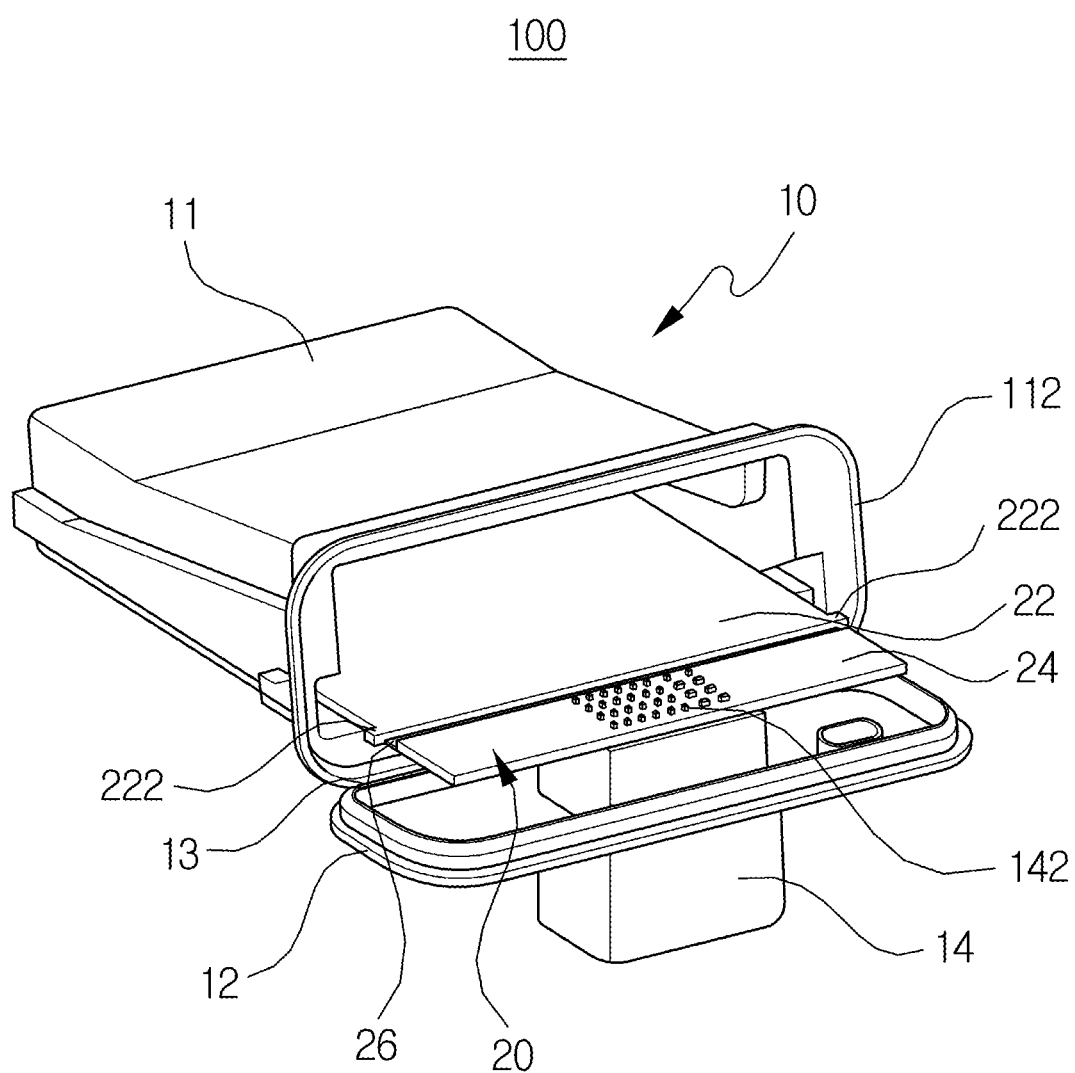
FIG. 3 is a diagram illustrating an open state of the electronic control device according to the exemplary embodiment of the present invention.
Figure 4:
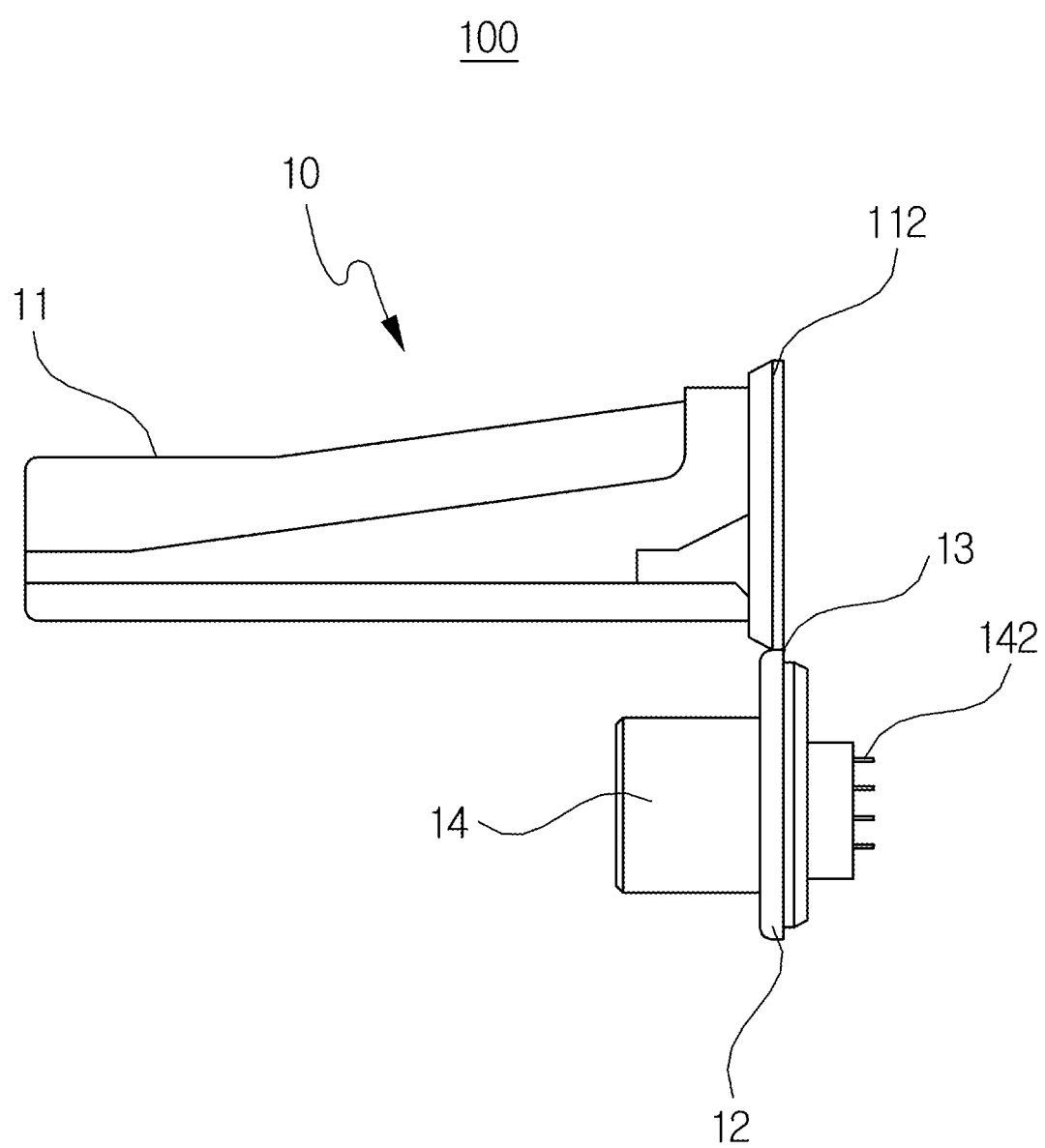
FIG. 4 is a side view illustrating the open state of the electronic control device according to the exemplary embodiment of the present invention.

FIG. 1 is an overall perspective view of an electronic control device according to an exemplary embodiment of the present invention, FIG. 2 is a diagram illustrating a lateral surface of the electronic control device according to the exemplary embodiment of the present invention, FIG. 3 is a diagram illustrating an open state of the electronic control device according to the exemplary embodiment of the present invention, and FIG. 4 is a side view illustrating the open state of the electronic control device according to the exemplary embodiment of the present invention. In this case, the illustration of a printed circuit board 20 which is to be described with reference to FIG. 4 will be omitted.

Referring to FIGS. 1 to 4, an electronic control device 100 includes a housing 10, a connector 14 integrally coupled with the housing 10, and a printed circuit board 20 inserted into the housing 10. In this case, the housing 10 and the connector 14 may be integrally formed by injection.

Although not illustrated, a plurality of electronic control elements may be formed on one surface of the printed circuit board 20, and the plurality of electronic control elements may be electrically connected with the connector 14 to perform various electronic controls.

In particular, the housing 10 includes a first body 11 formed with an opening at one side and a second body 12 connected with the first body 11 through a hinge part 13, and the opening may be opened or closed according to a rotation of the second body 12.

In this case, the second body 12 is coupled to a coupling part 112 formed in the opening of the first body 11 to be coupled with the first body, and when the second body 12 is coupled to the coupling part 112, one side (opening) of the housing 10 may be closed.

When the first body 11 is coupled with the second body 12, a gap between the first body 11 and the second body 12 may be sealed by a welding method. For example, the welding method may include a hot plate welding method, a vibration welding method, and an ultrasonic welding method.

The connector 14 may be integrally coupled with the second body 12.

The printed circuit board 20 includes a first substrate part 22 and a second substrate part 24 connected through a flexible connection part 26.

As an example, the flexible connection part 26 may be a flexible circuit or a flexible cable. The flexible connection part 26 may be formed by using a part of the printed circuit board 20, and the flexible connection part 26 may be configured to mechanically and electrically connect the first substrate part 22 and the second substrate part 24.

At least one terminal 142 may be provided to one side of the connector 14. The terminal 142 may be coupled to the connector by a press-fit method.

The terminal 142 may be coupled to one side of the second substrate part 24. The terminal 142 may be coupled to the second substrate part 24 by the press-fit method, and as illustrated in FIG. 3, the terminal 142 may be coupled to an appropriate center of the second substrate part 24.

Accordingly, the connector 14 may be mechanically and electrically coupled with the printed circuit board 20, particularly, the second substrate part 24.

The second substrate part 24 may be coupled with the connector 14 to be connected with the second body 12.

Figure 5:
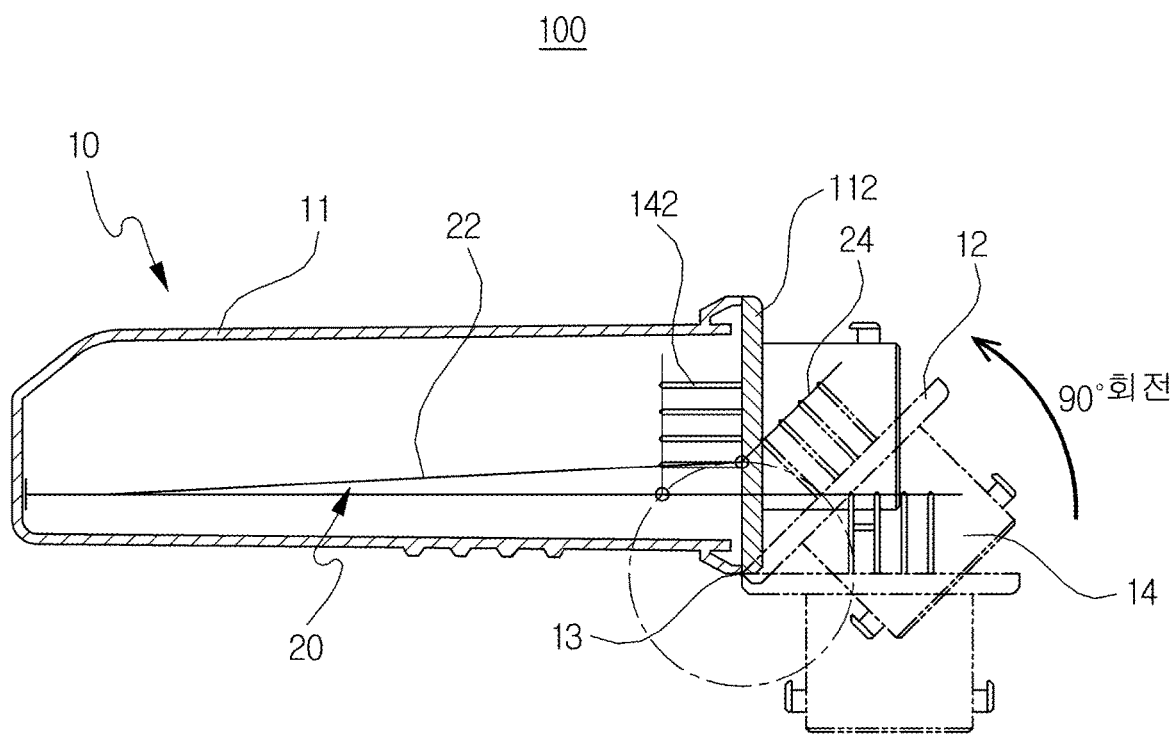
FIG. 5 is a diagram schematically illustrating a change in a position of a printed circuit board when the electronic control device is assembled according to the exemplary embodiment of the present invention.

FIG. 5 is a diagram schematically illustrating a change in a position of the printed circuit board 20 when the electronic control device 100 is assembled according to the exemplary embodiment of the present invention. In this case, illustration of an inclined part 114, a flat part 116, and a fixed part 118 which are to be described with reference to FIG. 5 will be omitted.

As illustrated in FIG. 5, when the second body 12 rotates in a direction of the first body 11, the positions of the first substrate part 22 and the second substrate part 24 may also be changed.

In this case, the first substrate part 22 may be finally inserted into the first body 11 while at least a part of the first substrate part 22 moves up or moves down according to the position of the hinge part 13 changed according to the rotation of the second body 12 in the direction of the first body 11.

In particular, when the second body 12 starts to be rotated in the direction of the first body 11, the insertion of the first substrate part 22 into the first body 11 may begin. In this case, as illustrated in FIG. 5, at least a part of the first substrate part 22 may move up while the flexible connection part 26 moves up.

Thereafter, when one side of the first substrate part 22 is completely inserted into the first body 11, the flexible connection part 26 moves down and the second substrate part 24 may also move down.

As illustrated in FIG. 5, when the second body 12 is rotated in the direction of the first body 11, the second substrate part 24 may also move up according to the moving-up of the flexible connection part 26.

Thereafter, when one side of the first substrate part 22 is completely inserted into the first body 11, the flexible connection part 26 moves down and the first substrate part 22 may also move down.

In the state where one side of the first substrate part 22 is completely inserted into the first body 11, the second body 12 may be coupled to the coupling part 112, and in this state, the second substrate part may have an angle perpendicular to the first substrate part 22.

In the meantime, as described above, when the second body 12 is rotated in the direction of the first body 11, the first substrate part 22 may be inserted into the first body 11 while at least a part of the first substrate part 22 moves up or moves down.

In this case, when there is no configuration for guiding the movement of the first substrate part 22, the electronic control element may be damaged due to a friction or a collision between the electronic control element provided on the first substrate part 22 and the inner surface of the first body 11.

In order to prevent the problem, the present invention may include the configuration of the inclined portion 114 formed on an inner upper end surface of the first body 11.

Figure 6A:
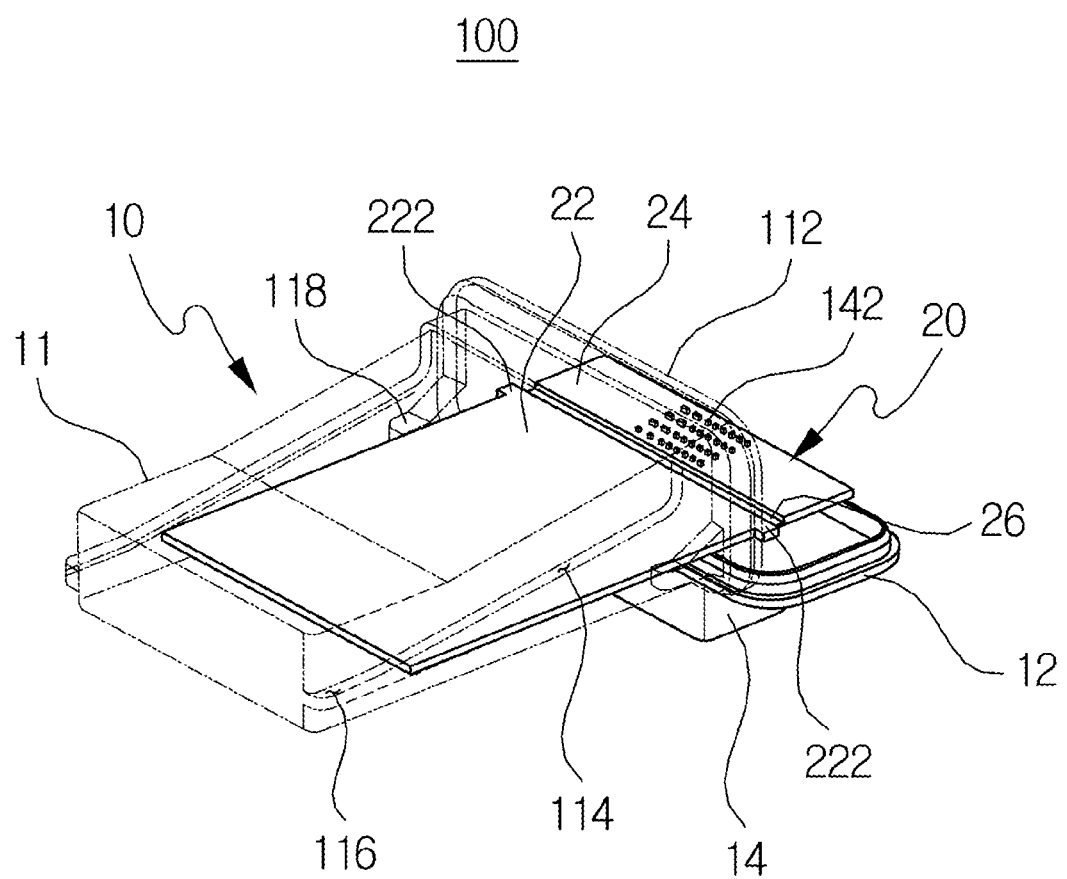
FIGS. 6(a) and 6(b) are diagrams illustrating an assembling process of the electronic control device according to the exemplary embodiment of the present invention.
Figure 6B:
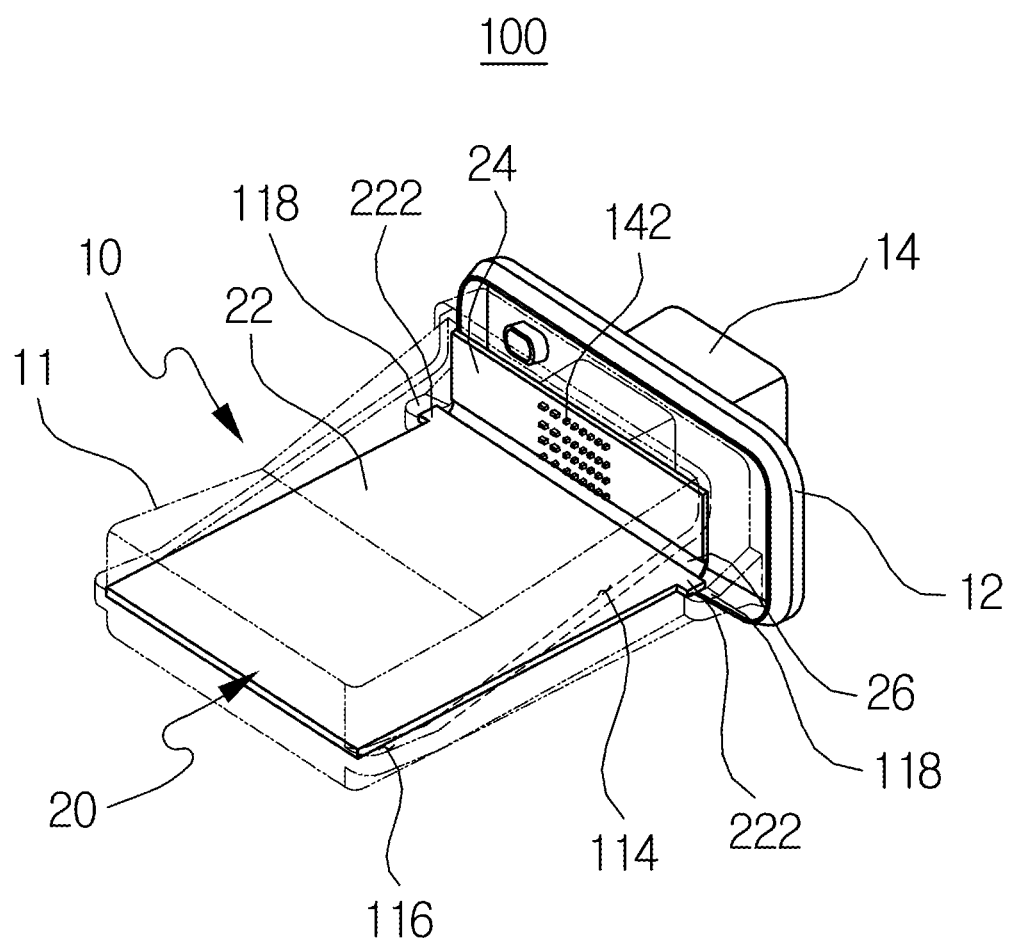
Figure 7A:
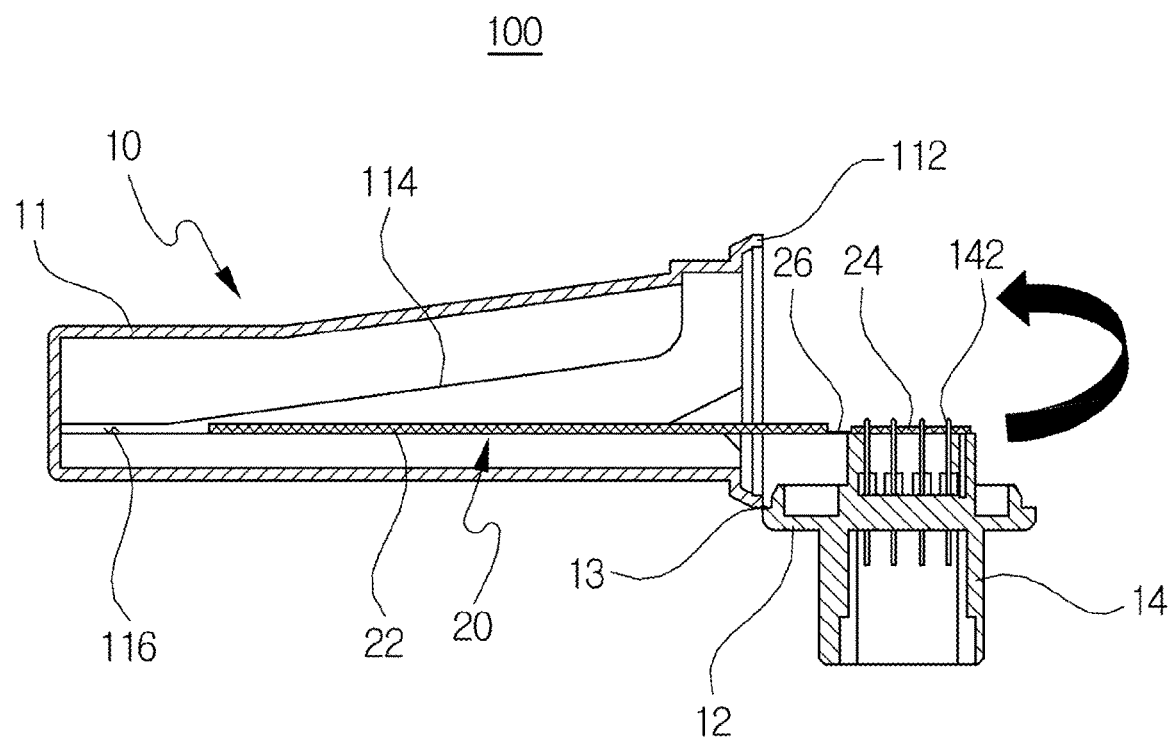
FIGS. 7(a) and 7(b) are side cross-sectional views illustrating the assembling process of the electronic control device according to the exemplary embodiment of the present invention.
Figure 7B:
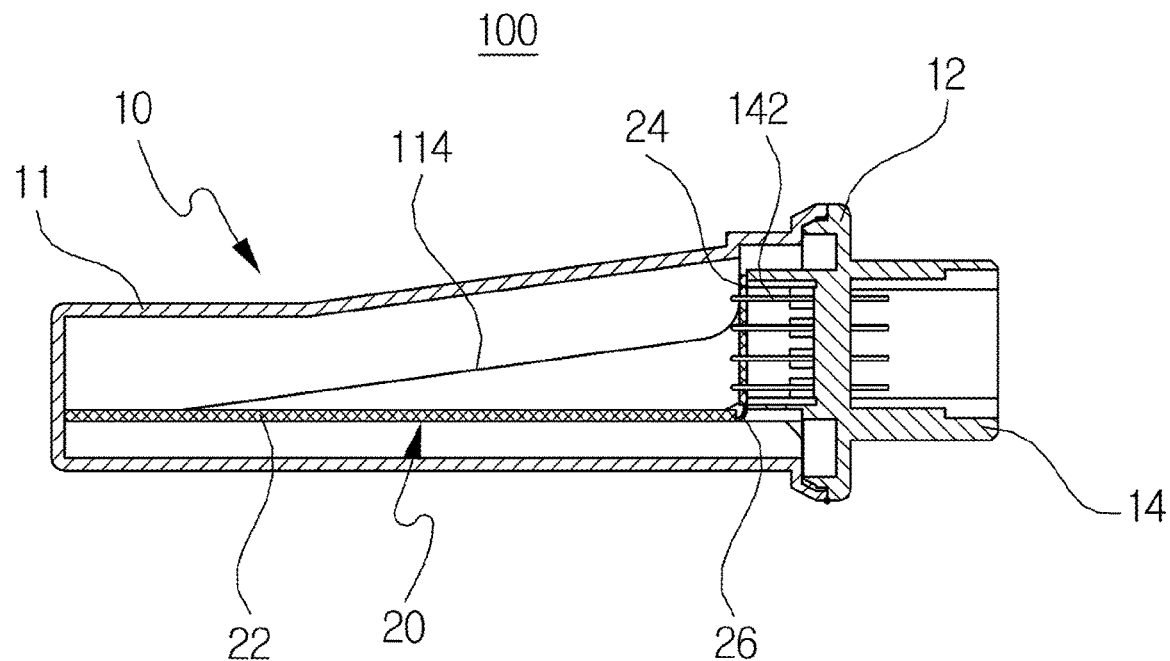

FIG. 6 is a diagram illustrating an assembling process of the electronic control device 100 according to the exemplary embodiment of the present invention, and FIG. 7 is a side cross-sectional view illustrating the assembling process of the electronic control device 100 according to the exemplary embodiment of the present invention. Hereinafter, FIGS. 6A and 7A are the diagrams illustrating the state where one side of the housing 10 is opened, and FIGS. 6B and 7B are the diagrams illustrating the state where the first body 11 and the second body 12 are coupled, so that one side of the housing 10 is closed.

Referring to FIGS. 6 and 7, the first body 11 includes the flat portion 116 formed at one end inside the first body 11, the inclined portion 114 formed at an upper surface of the inside of the first body 11, and the fixed portion 118 formed near the other end of the first body 11.

One side of the first substrate part 22 may be inserted into the flat portion 116. In this case, one side of the first substrate part 22 may be the front side of the first substrate part 22.

As illustrated in FIGS. 6B and 7B, when the second body 12 is rotated 90° in the direction of the first body 11 and thus the second body 12 is completely coupled with the first body 11, one side of the first substrate part 22 inserted into the flat portion 116 may be fixed to the first body 11 without shaking.

The inclined part 114 may extend from one side of the flat portion 116, and may be formed to be inclined so as to have a predetermined angle with respect to the flat portion 116. In this case, the inclined portion 114 may guide the movement of the first substrate part 22 when the first substrate part 22 is inserted into the first body 11.

Through the configuration of the inclined portion 114, it is possible to prevent a friction or a collision between the electronic control element provided on the first substrate part 22 and the inner surface of the first body 11 incurable due to the movement generated according to the moving-up or the moving-down of the first substrate part 22 when the second body 12 is rotated in the direction of the first body 11.

In the process in which the second body 12 is rotated in the direction of the first body 11, the first substrate part 22 may be naturally inserted into the first body 11 along the inclined portion 114.

The other side of the first substrate part 22 may be fixed to the fixed portion 118. In this case, the other side of the first substrate part 22 may be the rear side of the first substrate part 22. In this case, the first substrate part 22 includes a protrusion 222 inserted into the fixed portion 118 at the other side thereof.

As illustrated in FIGS. 6B and 7B, when the second body 12 is rotated 90° in the direction of the first body 11 so that the second body 12 is completely coupled with the first body 11, the protrusion 222 is inserted into the fixed portion 118, so that the other side of the first substrate part 22 may be fixed to the first body 11 without shaking.

In the states illustrated in FIGS. 6B and 7B, the second substrate part 24 may have an angle perpendicular to the first substrate part 22.

According to the present invention, there is an advantage in that it is possible to provide the electronic control device 100 in which the housing 10 and the connector 14 are integrally configured to reduce costs.

There is an advantage in that it is possible to provide the electronic control device 100 in which the housing 10 and the connector 14 are integrally configured, so that the number of components is relatively small and an assembling process is simple.

Although the exemplary embodiment of the present invention has been described for illustrative purposes, those skilled in the art will appreciate that various modifications, additions and substitutions are possible, without departing from the essential characteristic of the invention. Therefore, the embodiments disclosed in the present invention and the accompanying drawings are not intended to limit the technical spirit of the present invention, but are intended to illustrate the scope of the technical idea of the present invention, and the scope of the present invention is not limited by the embodiment and the accompanying drawings. The scope of the present invention shall be construed on the basis of the accompanying claims in such a manner that all of the technical ideas included within the scope equivalent to the claims belong to the scope of the present invention.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. An electronic control device, comprising:
    a housing including a first body formed with an opening at one side and a second body connected with the first body through a hinge part, the opening being closed according to a rotation of the second body;
    a printed circuit board including a first substrate part and a second substrate part connected through a flexible connection part; and
    a connector coupled to the second body,
    wherein the first substrate part is inserted into the first body, and the second substrate part is coupled with the connector to be connected with the second body, and
    wherein the first body includes:
        a coupling part coupled to the second body;
        a flat portion which is formed at one inner end of the first body and to which one side of the first substrate part is inserted;
        an inclined portion formed at an inner upper end surface of the first body, extending from one side of the flat portion, and formed to be inclined to have a predetermined angle to the flat portion; and
        a fixed portion to which the other side of the first substrate part is fixed.

2. The electronic control device of claim 1, wherein when the second body is rotated in a direction of the first body, the first substrate part is inserted into the first body while at least a part of the first substrate part moves up or moves down according to a position of the hinge part.

3. The electronic control device of claim 1, wherein the inclined portion guides a movement of the first substrate part when the first substrate part is inserted into the first body.

4. The electronic control device of claim 1, wherein the first substrate part includes a protrusion inserted into the fixed portion at the other side.

5. The electronic control device of claim 1, wherein the second substrate part has an angle perpendicular to the first substrate part when the second body is coupled to the coupling part.

6. The electronic control device of claim 1, wherein the connector is provided with at least one terminal at one side, and the terminal is coupled to one side of the second substrate part.

* * * * *